(12) United States Patent
Gaspari

(10) Patent No.: US 9,391,218 B2
(45) Date of Patent: Jul. 12, 2016

(54) VOLTAIC CELL POWERED BY RADIOACTIVE MATERIAL

(71) Applicant: IntriEnergy Inc., Denver, CO (US)

(72) Inventor: Franco Gaspari, Toronto (CA)

(73) Assignee: IntriEnergy Inc., Denver, CO (US)

( * ) Notice: Subject to any disclaimer, the term of this patent is extended or adjusted under 35 U.S.C. 154(b) by 255 days.

(21) Appl. No.: 14/317,541

(22) Filed: Jun. 27, 2014

(65) Prior Publication Data

US 2015/0380582 A1 Dec. 31, 2015

(51) Int. Cl.
| | |
|---|---|
| H01L 25/00 | (2006.01) |
| H01L 31/042 | (2014.01) |
| H01L 31/0443 | (2014.01) |
| H01L 31/032 | (2006.01) |
| H01L 31/0352 | (2006.01) |
| G21H 1/06 | (2006.01) |

(52) U.S. Cl.
CPC .......... *H01L 31/035218* (2013.01); *G21H 1/06* (2013.01)

(58) Field of Classification Search
CPC ............... H01L 31/035218; H01L 27/1214; H01L 27/12; H01L 29/66757; H01L 29/78621
See application file for complete search history.

(56) References Cited

U.S. PATENT DOCUMENTS

| | | | |
|---|---|---|---|
| 5,859,484 A | 1/1999 | Mannik et al. | |
| 6,146,608 A | 11/2000 | Todd et al. | |
| 6,238,812 B1 | 5/2001 | Brown et al. | |
| 7,442,320 B2 * | 10/2008 | Lee .................. | H01L 31/03529 136/256 |
| 7,482,635 B2 | 1/2009 | Kobayakawa et al. | |
| 7,601,979 B2 | 10/2009 | Miki et al. | |
| 7,615,206 B2 | 11/2009 | Sandhage et al. | |
| 7,622,532 B2 | 11/2009 | Gadeken et al. | |
| 7,663,288 B2 | 2/2010 | Chandrashekkar et al. | |
| 7,718,283 B2 | 5/2010 | Raffaelle et al. | |
| 7,867,639 B2 | 1/2011 | Raffaelle et al. | |
| 7,867,640 B2 | 1/2011 | Raffaelle et al. | |
| 7,939,986 B2 | 5/2011 | Chandrashekhar et al. | |
| 8,017,412 B2 | 9/2011 | Spencer et al. | |
| 8,134,216 B2 | 3/2012 | Spencer et al. | |
| 8,153,453 B2 | 4/2012 | Spencer et al. | |
| 8,487,392 B2 | 7/2013 | Spencer et al. | |
| 8,487,507 B1 * | 7/2013 | Cabauy ................... | G21H 1/06 310/301 |

(Continued)

FOREIGN PATENT DOCUMENTS

EP 2453484 A1 5/2012

OTHER PUBLICATIONS

Opitz-Coutureau, J; International Search Report from corresponding International Patent Application No. PCT/US2015/037061; Nov. 20, 2015; pp. 1-4; European Patent Office as International Searching Authority; Munich, Germany.

(Continued)

*Primary Examiner* — Thomas L Dickey
*Assistant Examiner* — Damon Hillman
(74) *Attorney, Agent, or Firm* — Ballard Spahr LLP

(57) ABSTRACT

A voltaic cell uses a radioactive material for energy. Energetic particles emitted by the radioactive material boost charge carriers within a semiconductor lattice into higher energy bands. Dielectric layers having quantum dots tuned by size and spacing (density) to favor particles having specific energies permit quantum mechanical tunneling of the charge carriers before they lose significant energy, are captured, or recombine. The energetic carriers tunnel to an electrical circuit, where they perform work.

95 Claims, 5 Drawing Sheets

(56) References Cited

U.S. PATENT DOCUMENTS

| | | |
|---|---|---|
| 8,492,861 B1 | 7/2013 | Moosman et al. |
| 8,569,610 B2 | 10/2013 | Smith et al. |
| 8,658,889 B2 * | 2/2014 | Huang ............ H01L 31/035218 136/264 |
| 2002/0117675 A1 * | 8/2002 | Mascarenhas ........ H01L 29/167 257/87 |
| 2008/0199736 A1 | 8/2008 | Gadeken et al. |
| 2010/0183919 A1 * | 7/2010 | Holme .................. B82Y 10/00 429/209 |
| 2010/0204408 A1 | 8/2010 | Gadeken et al. |
| 2011/0266675 A1 | 11/2011 | Deymier et al. |
| 2012/0133244 A1 | 5/2012 | Spencer et al. |
| 2012/0149142 A1 | 6/2012 | Spencer et al. |
| 2012/0160298 A1 | 6/2012 | Kanamoto et al. |
| 2013/0000727 A1 | 1/2013 | Iwata et al. |
| 2013/0121449 A1 | 5/2013 | Popa-Simil |

OTHER PUBLICATIONS

Opitz-Coutureau, J; Written Opinion of the International Searching Authority from corresponding International Patent Application No. PCT/US2015/037061; Nov. 20, 2015; pp. 1-6; European Patent Office as International Searching Authority; Munich, Germany.

Conibeer et al. "Silicon quantum dot nanostructures for tandem photovoltaic cells"; Thin Solid Films, Elsevier-Sequoia S.A. Lausanne, CH, vol. 516, No. 20, Aug. 30, 2008, pp. 6748-6756.

Schnabel et al. "Electrical Properties of Recrystallised SIC Films From PECVD Precursors for Silicon Quantum Dot Solar Cell Applications"; Proceedings/ 26th European Photovoltaic Solar Energy Conference and Exhibition; The Most Inspiring Platform for the Global PV Solar Sector; CCH Congress Centre and International Fair, Hamburg, Germany, Sep. 5, 2011 through Sep. 9, 2011.

\* cited by examiner

VOLTAIC CELL POWERED BY RADIOACTIVE MATERIAL

FIELD OF THE INVENTION

This invention concerns semiconductor voltaic cells powered by radioactive material, the cells having quantum structures for increased efficiency and longer life.

BACKGROUND

Known semiconductor voltaic cells for the generation of electrical energy using a radioactive energy source suffer from several disadvantages, including a relatively low voltage output, relatively low power output and a relatively short life. These disadvantages are caused largely by the failure to efficiently harness the energy of the charge carriers (electrons and holes) when they are excited into higher energy levels by collisions with the energetic particles (e.g., alpha particles, beta particles) released during decay of the radioactive energy source. Although the charge carrier collisions create electrons in the conduction band and corresponding holes in the valence band, it is customary to describe only the electrons, it being understood that the same processes that affect the electrons also affect the holes. The excited carriers may lose energy through inelastic collisions, such as phonon excitation of the semiconductor lattice, they may recombine, or they may be captured by the radioactive decay products (such as defects produced when tritium decays) which accumulate in the semiconductor lattice as the cell ages. The voltage, power, and life of such cells could be increased by collecting the excited carriers while they are in the energy bands above the conduction band and before they lose significant kinetic energy through collisions, recombine or are captured by radioactive decay products.

SUMMARY

The invention concerns a voltaic cell. In one example embodiment the voltaic cell comprises a radioactive layer comprising a radioactive material, the radioactive layer having first and second sides oppositely disposed. A first n-type semiconductor layer overlies the first side of the radioactive layer. A first p-type semiconductor layer overlies the second side of the radioactive layer. A first dielectric layer overlies the first n-type semiconductor layer; the first dielectric layer comprises a plurality of quantum dots. A second dielectric layer overlies the first p-type semiconductor layer; the second dielectric layer comprises a plurality of quantum dots. A first conductor layer overlies the first dielectric layer, and a second conductor layer overlies the second dielectric layer.

A particular example of the voltaic cell may further comprise a second n-type semiconductor layer positioned between the first conductor layer and the first dielectric layer, and a second p-type semiconductor layer positioned between the second conductor layer and the second dielectric layer.

By way of example, the radioactive layer may comprise a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

Further by way of example, the radioactive material may be selected from the group consisting of tritium, carbon 14, magnesium 23, germanium 76, silicon 32, cadmium 113, indium 115 rubidium 87, potassium 40 and combinations thereof.

In an example embodiment, the first n-type semiconductor layer may comprise a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

In a particular example embodiment, the first n-type semiconductor layer is doped with an element selected from the group consisting of phosphorous, nitrogen, arsenic, antimony and combinations thereof.

By way of further example, the first p-type semiconductor layer may comprise a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

Additionally by way of example, the first p-type semiconductor layer is doped with an element selected from the group consisting of boron, aluminum, gallium, indium and combinations thereof.

In a further example, the second n-type semiconductor layer may comprise a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

In a particular example, the second n-type semiconductor layer is doped with an element selected from the group consisting of phosphorous, nitrogen, arsenic, antimony and combinations thereof.

In an example embodiment, the second p-type semiconductor layer may comprise a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

In a particular embodiment, the second p-type semiconductor layer is doped with an element selected from the group consisting of boron, aluminum, gallium, indium and combinations thereof.

In a further example embodiment, at least one of the first and second conductor layers comprise a metal. In this example the metal may be selected from the group consisting of gold, silver, copper, aluminum and combinations thereof.

In an example embodiment, at least one of the first and second dielectric layers comprises a material selected from the group consisting of silicon oxide and silicon nitride.

By way of example, the quantum dots comprise silicon. In a particular example embodiment, the quantum dots have a size from about 1 nm to about 10 nm. By way of further example, the quantum dots may be disbursed throughout at least one of the first and second dielectric layers at a density of about $10^{21}$ cm$^{-3}$. In another embodiment, the quantum dots may be disbursed throughout at least one of the first and second dielectric layers at a density from about $10^8$ cm$^{-2}$ to about $10^{11}$ cm$^{-2}$.

In one example embodiment, the quantum dots are arranged in a three-dimensional array in at least one of the first and second dielectric layers. In another example, the quantum dots are arranged substantially at the surface of at least one of the first and second dielectric layers. By way of example, the quantum dots may have a substantially spherical shape or a substantially pyramidal shape.

In an example embodiment, the quantum dots are sized and spaced apart from one another within the dielectric layers so as to promote quantum mechanical tunneling of charge carriers from the radioactive layer to the conductor layers. In a particular example embodiment, the charge carriers may have energies from about 1 eV to about 5 eV.

By way of further example, a plurality of first dielectric layers may be positioned between the first n-type semiconductor layer and the first conductor layer. A particular example embodiment may comprise at least three of the first dielectric layers.

In an example embodiment, the quantum dots of at least one of the first dielectric layers are of a different size from the quantum dots of at least one other of the first dielectric layers. In a further example, the quantum dots of at least one of the first dielectric layers are spaced apart from one another at a different spacing from the quantum dots of at least one other of the first dielectric layers.

In another example, a plurality of second dielectric layers may be positioned between the first p-type semiconductor layer and the second conductor layer. A particular example embodiment may comprise at least three of the second dielectric layers.

In an example, the quantum dots of at least one of the second dielectric layers are of a different size from the quantum dots of at least one other of the second dielectric layers. Further by way of example, the quantum dots of at least one of the second dielectric layers are spaced apart from one another at a different spacing from the quantum dots of at least one other of the second dielectric layers.

An example voltaic cell may further comprise a first tunnel junction layer positioned between the second n-type semiconductor layer and the first conductor layer, a third p-type semiconductor layer positioned between the first tunnel junction layer and the first conductor layer, and a third n-type semiconductor layer positioned between the third p-type semiconductor layer and the first conductor layer. In a particular embodiment, the first tunnel junction layer may comprise a p-n junction.

An example voltaic cell may further comprise a second tunnel junction layer positioned between the second p-type semiconductor layer and the second conductor layer, a fourth n-type semiconductor layer positioned between the second tunnel junction layer and the second conductor layer, and a fourth p-type semiconductor layer positioned between the fourth n-type semiconductor layer and the second conductor layer. In a particular example, the second tunnel junction layer comprises a p-n junction.

The invention further encompasses an example battery comprising a plurality of voltaic cells according to the example embodiments disclosed above.

Another example voltaic cell comprises a semiconductor layer having a p-type region and an n-type region forming a first p-n junction. A radioactive layer is positioned within the semiconductor layer between the p-type region and the n-type region. At least a first dielectric layer overlies the n-type region, the first dielectric layer comprising a plurality of quantum dots. At least a second dielectric layer overlies the p-type region, the second dielectric layer comprising a plurality of quantum dots. An n-type semiconductor layer overlies the first dielectric layer. A p-type semiconductor layer overlies the second dielectric layer. A first conductor layer overlies the n-type semiconductor layer. A second conductor layer overlies the p-type semiconductor layer. The example may further comprise a plurality of the first dielectric layers overlying the n-type region and a plurality of the second dielectric layers overlying the p-type region.

By way of further example, a second p-n junction having a p-type region and an n-type region may be positioned between the n-type semiconductor layer and the first conductor layer, the p-type region of the second p-n junction being adjacent to the n-type semiconductor layer. A first tunnel junction layer may be positioned between the p-type region of the second p-n junction and the n-type semi-conductor layer. A third p-n junction having a p-type region and an n-type region may be positioned between the p-type semiconductor layer and the second conductor layer, the n-type region of the third p-n junction being adjacent to the p-type semiconductor layer. A second tunnel junction layer may be positioned between the n-type region of the third p-n junction and the p-type semiconductor layer.

In a further example, the voltaic cell may comprise a second p-n junction having a p-type region and an n-type region, the second p-n junction being positioned between the n-type semiconductor layer and the first conductor layer, the p-type region of the second p-n junction being adjacent to the n-type semiconductor layer. A first tunnel junction layer may be positioned between the p-type region of the second p-n junction and the n-type semi-conductor layer. A third p-n junction having a p-type region and an n-type region may be positioned between the p-type semiconductor layer and the second conductor layer, the n-type region of the third p-n junction being adjacent to the p-type semiconductor layer. A second tunnel junction layer may be positioned between the n-type region of the third p-n junction and the p-type semiconductor layer.

Another example voltaic cell comprises a radioactive layer comprising a radioactive material and a semiconductor having energy band gaps from about 1 eV to about 4 eV, the radioactive layer having first and second sides oppositely disposed. A first n-type semiconductor layer overies the first side of the radioactive layer. A first p-type semiconductor layer overlies the second side of the radioactive layer. A first dielectric layer overlies the first n-type semiconductor layer, the first dielectric layer comprising a plurality of quantum dots. A second dielectric layer overlies the first p-type semiconductor layer, the second dielectric layer comprising a plurality of quantum dots. A first conductor layer overlies the first dielectric layer, and a second conductor layer overlying the second dielectric layer.

By way of example, the voltaic cell may further comprise a second n-type semiconductor layer positioned between the first conductor layer and the first dielectric layer, and a second p-type semiconductor layer positioned between the second conductor layer and the second dielectric layer.

In another example, the voltaic cell may also comprise a first tunnel junction layer positioned between the second n-type semiconductor layer and the first conductor layer. A third p-type semiconductor layer may be positioned between the first tunnel junction layer and the first conductor layer, and a third n-type semiconductor layer may be positioned between the third p-type semiconductor layer and the first conductor layer.

By way of further example, a second tunnel junction layer may be positioned between the second p-type semiconductor layer and the second conductor layer. A fourth n-type semiconductor layer may be positioned between the second tunnel junction layer and the second conductor layer, and fourth p-type semiconductor layer may be positioned between the fourth n-type semiconductor layer and the second conductor layer.

DETAILED DESCRIPTION

Figure 1:
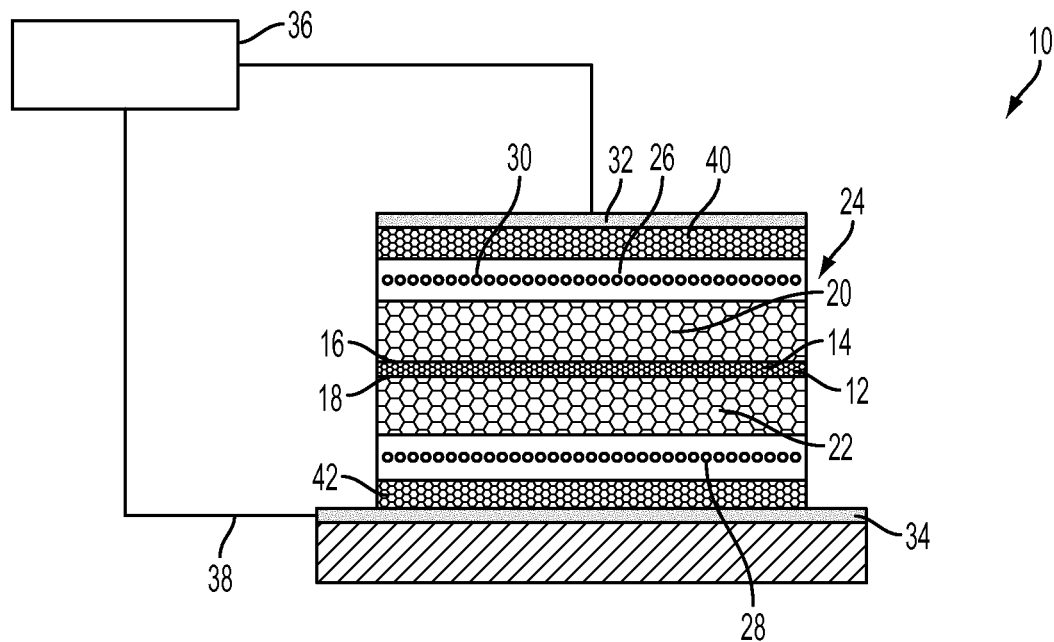
FIG. 1 is a schematic cross sectional view of an example voltaic cell according to the invention.

FIG. 1 shows, in schematic form, an example embodiment of a voltaic cell 10 according to the invention. Cell 10 has a radioactive layer 12 comprising a radioactive material 14. Layer 12 has first and second oppositely disposed sides 16 and 18. In this example, a first n-type semiconductor layer 20 overlies the first side 16, and a first p-type semiconductor layer 22 overlies the second side 18, forming a p-n junction 24. Although the elements of the p-n junction are described as "layers" this does not imply that the structure is a laminate of discrete layers. Rather than "layers", it is also convenient to describe the elements of the cell 10 as substantially continuous "regions" of a semiconductor substrate, i.e., a radioactive region 12, an n-type region 20 and a p-type region 22 formed by well-known semiconductor fabrication techniques. Thus the term "layer" as used herein denotes a region of a voltaic cell having certain properties, and does not necessarily imply a discrete layer of material. Furthermore, the term "overlies" as used herein denotes a relative position. Layers (or regions) that "overlie" other layers or regions may, in some example embodiments, be in contact (continuous) with one another, or there may be intervening layers or regions between layers or regions said to be in overlying relation depending upon the specific embodiment being described.

A first dielectric layer 26 overlies the n-type layer 20, and a second dielectric layer 28 overlies the p-type layer 22. Dielectric layers 26 and 28 comprise "quantum dots" 30 which are nanocrystal structures formed of semiconductor material. Quantum dots are sized so that they exhibit quantum mechanical behavior, and are used in the voltaic cell 10 to promote quantum mechanical tunneling of charge carriers (electrons and holes) as described below.

A first conductor layer 32 overlies dielectric layer 26, and a second conductor layer 34 overlies the dielectric layer 28. The conductor layers 32 and 34 form the electrical contacts to which a load 36 is attached to form an electrical circuit 38 powered by the voltaic cell 10. Conductor layers 32 and 34 may interface with the dielectric layers 26 and 28, or, as shown in FIG. 1, a second n-type semiconductor layer 40 may be positioned between conductor layer 32 and dielectric layer 26, and a second p-type semiconductor layer 42 may be positioned between conductor layer 34 and dielectric layer 28 to advantage as described below.

In a particular example embodiment, the radioactive material 14 may be tritium, which is an isotope of hydrogen that undergoes beta decay (emission of an electron). Other beta decay isotopes may also be used as radioactive material 14 to provide an energy source for the cell. Feasible beta decay isotopes include carbon 14, magnesium 23, germanium 76, silicon 32, cadmium 113, indium 115 rubidium 87 and potassium 40. The semiconductor substrate forming the radioactive layer 12 may be advantageously formed of an element that will bond with the tritium. Amorphous hydrogenated silicon is an excellent candidate for radioactive layer 12, and amorphous silicon may also comprise the n-type semiconductor layers 20 and 40 (when present) and the p-type semiconductor layers 22 and 42 (when present). Other candidate semiconductor materials for the radioactive layer 12 include crystalline hydrogenated silicon, amorphous hydrogenated silicon carbide, crystalline hydrogenated silicon carbide, diamond-like carbon, amorphous hydrogenated carbon and crystalline hydrogenated carbon.

Additional candidate materials for the p-type and n-type semiconductor layers 20, 22, 40 and 42 include crystalline silicon as well as germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous. It is expected that advantages will be realized for semiconductors having energy gaps from about 1 eV to about 4 eV. The n-type layers may be doped with phosphorous, nitrogen, arsenic, or antimony, and the p-type layers may be doped with boron, aluminum, gallium or indium. For the conductor layers 32 and 34, a metal, such as gold, silver, copper or aluminum may be used, as these metals are excellent electrical conductors.

The dielectric layers 26 and 28 may be formed of silicon oxide or silicon nitride. The quantum dots 30 may advantageously comprise silicon, precipitated out during the formation of the silicon oxide or silicon nitride dielectric layers 26 and 28 using silicon rich silicon oxides or nitrides, wherein it is known that annealing will cause the extra silicon (in excess of the stoichiometric requirements) to precipitate into quantum dots, the size of the dots being dependent upon the annealing temperature and duration. It is expected that quantum dots 30 having a size range from about 1 nm to about 10 nm will be advantageous for use in voltaic cells according to the invention.

Quantum dots may also be formed of binary compounds such as cadmium selenide, cadmium sulfide, indium arsenide, and indium phosphide. Quantum dots may also be made from ternary compounds such as cadmium selenide sulfide. Quantum dots can contain as few as 100 to 100,000 atoms within the quantum dot volume, with a diameter of 10 to 50 atoms. This corresponds to about 2 to 10 nanometers, and at 10 nm in diameter, nearly 3 million quantum dots could be lined up end to end and fit within the width of a human thumb.

Some quantum dots are small regions of one material buried in another with a larger band gap. These can be so-called core-shell structures, e.g., with cadmium selenide in the core and zinc sulfide in the shell or from special forms of silica called ormosil. Individual quantum dots can be created from two-dimensional electron or hole gases present in remotely doped quantum wells or semiconductor heterostructures called lateral quantum dots. The sample surface is coated with a thin layer of resist. A lateral pattern is then defined in the resist by electron beam lithography. This pattern can then be transferred to the electron or hole gas by etching, or by depositing metal electrodes (lift-off process) that allow the application of external voltages between the electron gas and the electrodes.

Figure 2:
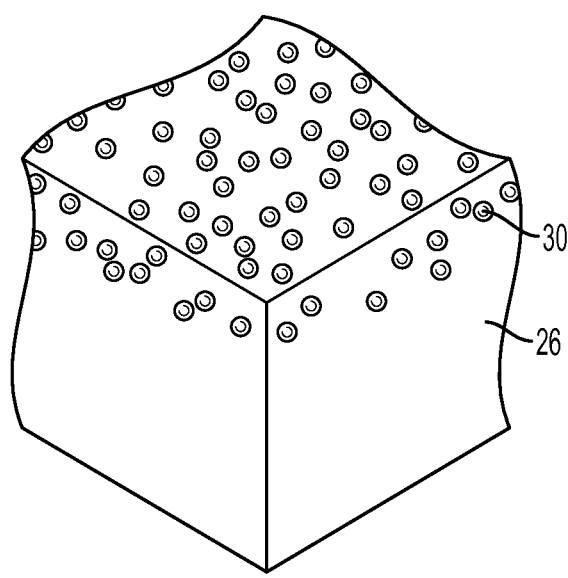
FIG. 2 is an isometric view of a portion of the example voltaic cell shown in FIG. 1.
Figure 2A:
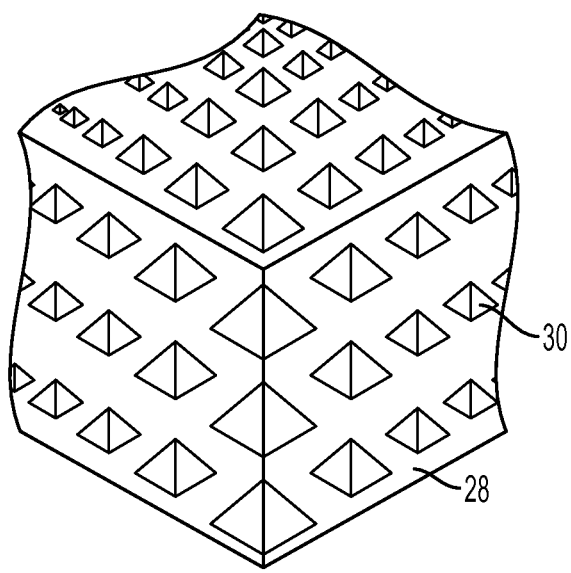
FIG. 2A is an isometric view of a portion of the example voltaic cell shown in FIG. 1.

It is further expected that quantum dots 30 being distributed throughout the dielectric layers 26 and 28 at a volume density up to $10^{21}$ cm$^{-3}$, or an areal (surface) density from about $10^8$ cm$^{-2}$ to about $10^{11}$ cm$^{-2}$ will be advantageous. As shown in FIGS. 2 and 2A, the quantum dots 30 may be substantially spherical or pyramidal (other shapes are also feasible), and may be distributed substantially at the surface of the dielectric layers 26 and 28, or throughout the volume of the layers in a three dimensional array.

The size of the quantum dots 30, their density (areal and volumetric) and spacing from one another are parameters that are coordinated to "tune" the dielectric layers so as to provide effective quantum mechanical tunneling of charge carriers from the radioactive semiconductor layer 12 (where the charge carriers are generated) to the conductor layers 32 and 34 so that they may do work through the load 36 of the circuit 38. Appropriate tuning of the arrangement and size of the quantum dots 30 will allow hitherto unusable charge carriers having energies in excess of the conduction band of the semiconductor substrates forming the voltaic cell 10 to be harnessed for work, thereby increasing the voltage and power output of the cell 10 over prior art cells. The life of the cell will also be extended, as a substantial number of the energetic charge carriers will be channeled to the conductor layers 32 and 34 before they are captured by radioactive decay products or lose energy through inelastic collisions within the semiconductor lattice. It is expected that charge carriers having energies from about 1 eV to about 5 eV will be available for work in circuit 38 using voltaic cells 10 according to the invention.

In operation, energetic particles (such as electrons when tritium is the radioactive material 14) are released from the radioactive material during decay. Energy from the particles is imparted to the radioactive layer 12 as well as the n-type and p-type semiconductor layers 20 and 22, in the form of collisions which create energetic charge carriers in the form of electrons and holes. It is calculated that each electron released by radioactive decay of tritium for example, will create approximately 1500 electrons and holes. These charge carriers have an energy distribution which places many of them above the conduction band. The p-n junction 24 formed by the n and p type semiconductor layers 20 and 22 has an inherent electrical field that sweeps the electrons and holes in opposite directions towards the dielectric layers 26 and 28 where the tuned quantum dots 30 conduct the carriers to the conductor layers 32 and 40 before they lose significant energy to collisions or are captured. Higher energy electrical carriers are thus available for work in the circuit 38. Additional, heavily doped n-type and p-type layers 40 and 42 may be added to augment the electric field of the p-n junction 24.

Figure 3:
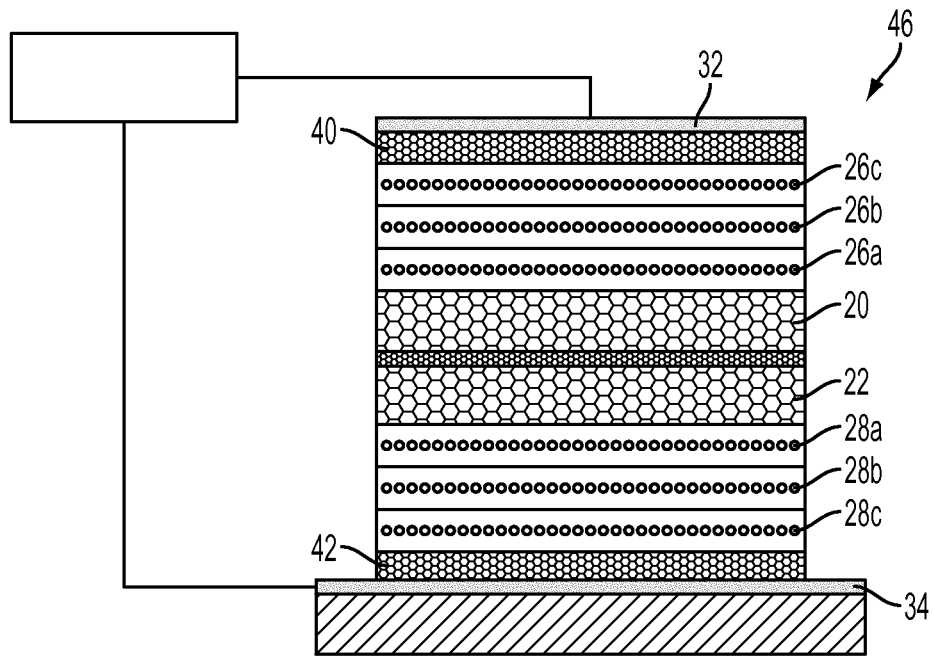
FIG. 3 is a schematic cross sectional view of another example voltaic cell according to the invention.

FIG. 3 shows another embodiment of a voltaic cell 46 according to the invention. Voltaic cell 46 has a plurality of dielectric layers 26 and 28. In this example, three dielectric layers 26a, 26b and 26c are shown between the n-type semiconductor layer 20 and the conductor layer 32, and three dielectric layers 28a, 28b and 28c are shown between the p-type semiconductor layer 22 and the conductor layer 34. (Note that although shown, there may or may not be second n-type and p-type semiconductor layers 40 and 42 present in this example.) While three dielectric layers on each side of the p-n junction 24 are shown in this example, it is understood that more or fewer dielectric layers are feasible. Multiple dielectric layers 26 and 28 permit different tuning of the quantum dots in the various layers to more effectively conduct charge carriers over a broader energy distribution. Each dielectric layer can be tuned to a particular energy range by varying the size of the quantum dots between each layer (i.e., the quantum dots of layer 26a may be larger than those of 26b), varying the spacing (density) of the quantum dots among the layers, varying the arrangement of quantum dots among layers (i.e., quantum dots on the surface of a layer versus arranged in a 3 dimensional lattice throughout the layer).

Figure 4:
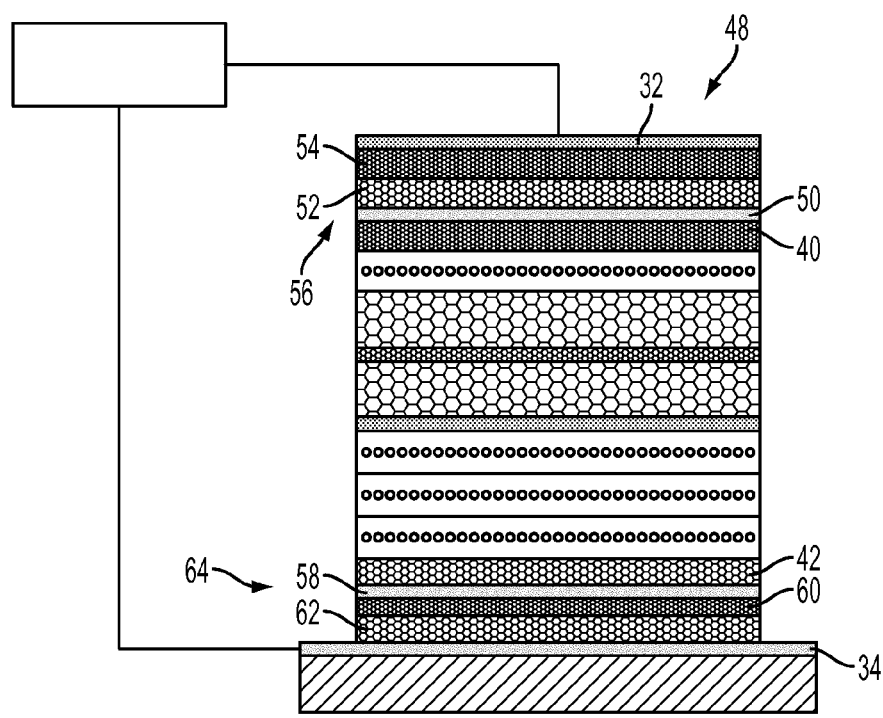
FIG. 4 is a schematic cross sectional view of another example voltaic cell according to the invention.

FIG. 4 illustrates another example embodiment of a voltaic cell 48 according to the invention. In addition to the structure described above and shown in FIG. 1, voltaic cell 48 comprises a first tunnel junction layer 50 positioned between the second n-type semiconductor layer 40 and the first conductor layer 32. A third p-type semiconductor layer 52 is positioned between the first tunnel junction layer 50 and the first conductor layer 32, and a third n-type semiconductor layer 54 is positioned between the third p-type semiconductor layer and the first conductor layer 32. The third p-type layer 52 and the third n-type layer 54 form a second p-n junction 56 having its p-type region (p-type semiconductor layer 52) adjacent to the n-type semiconductor layer 40. Similarly, voltaic cell 48 comprises a second tunnel junction layer 58 positioned between the second p-type semiconductor layer 42 and the second conductor layer 34. A fourth n-type semiconductor layer 60 is positioned between the second tunnel junction layer 58 and the second conductor layer 34, and a fourth p-type semiconductor layer 62 is positioned between the fourth n-type semiconductor layer 60 and the second conductor layer 34. The fourth p-type layer 62 and the fourth n-type layer 60 form a third p-n junction 64 having its n-type region (n-type semiconductor layer 60) adjacent to the p-type semiconductor layer 42.

The tunnel junction layers 50 and 58 are advantageously formed of thin, heavily doped p-n junction layers which enhance the quantum tunneling of the charge carriers to the contact layers 32 and 38. It is thought that tunnel junction layers having a thickness from about 5 nm to about 20 nm will be effective. The n and p-type semiconductor layers 52, 54, 60 and 62 may comprise amorphous or crystalline silicon, doped as appropriate for their majority charge carriers. Other semiconductor materials, including, for example, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous may also form these layers. The n and p-type semiconductor layers 52, 54, 60 and 62 act as scavenging layers by capturing additional electrons from the beta decay of the radioactive material 14.

Figure 5:
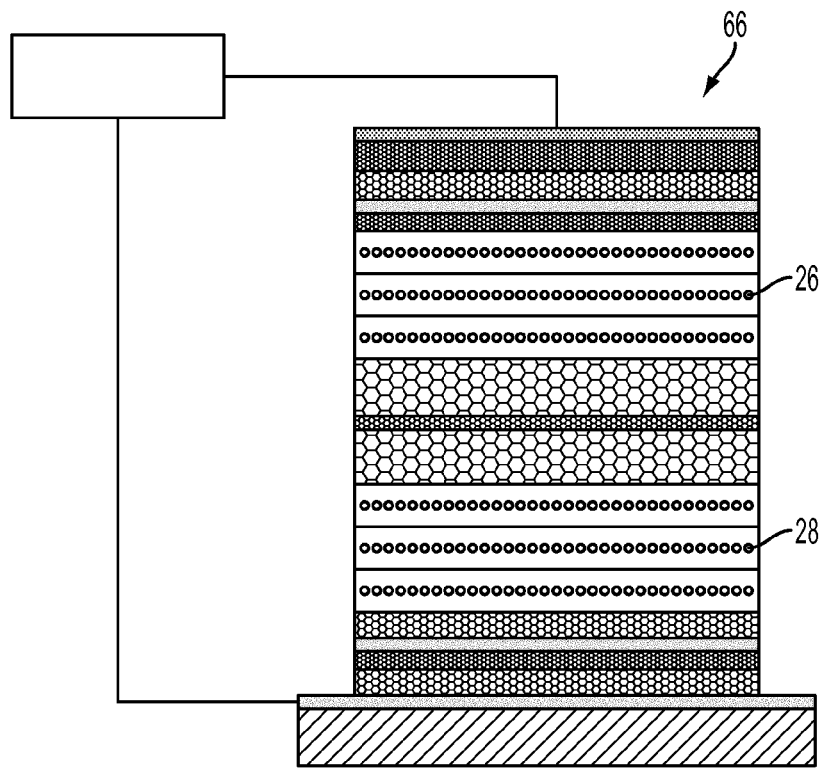
FIG. 5 is a schematic cross sectional view of another example voltaic cell according to the invention.
Figure 6:
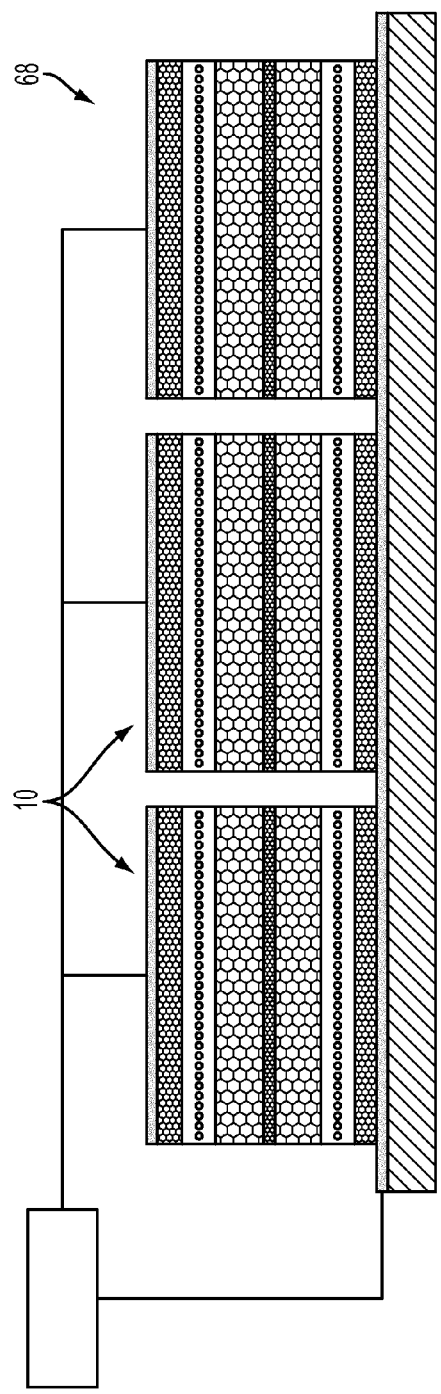
FIGS. 6-9 are schematic cross sectional views of example electrical batteries formed from example voltaic cells according to the invention.
Figure 7:
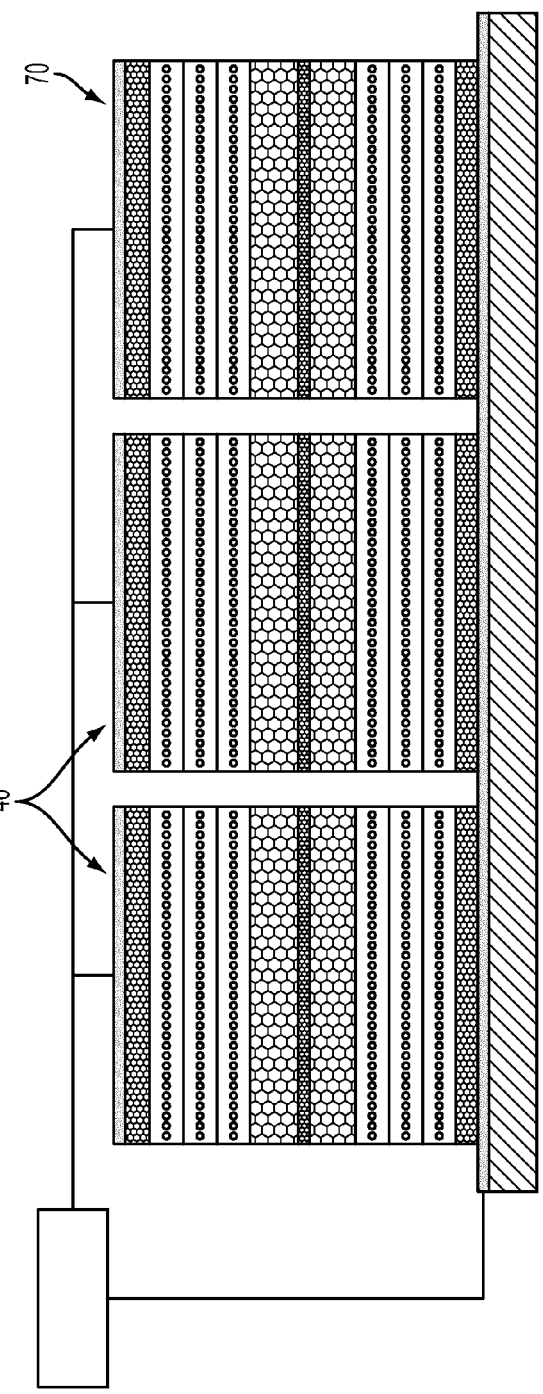
Figure 8:
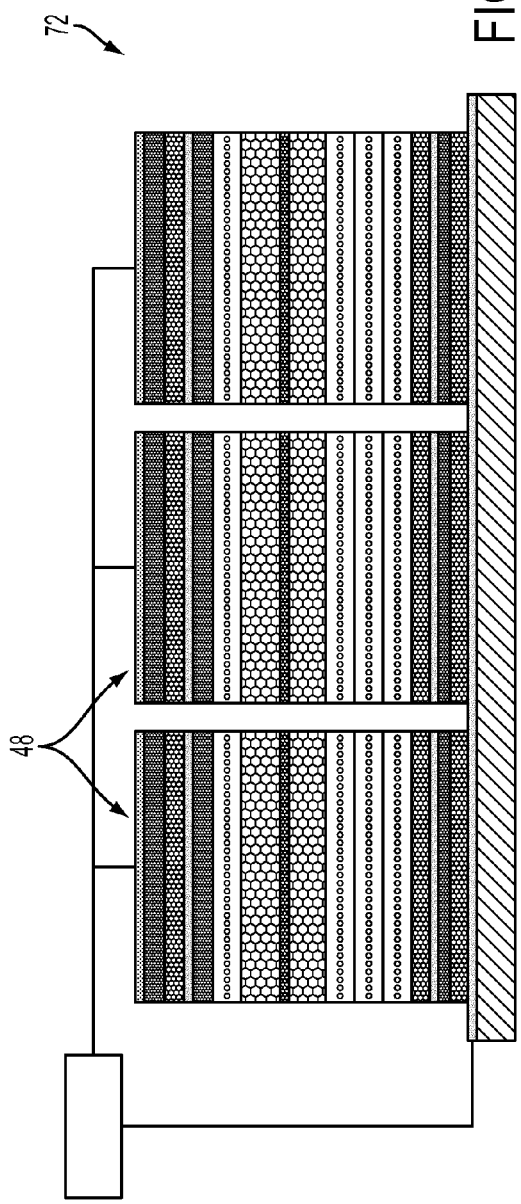
Figure 9:
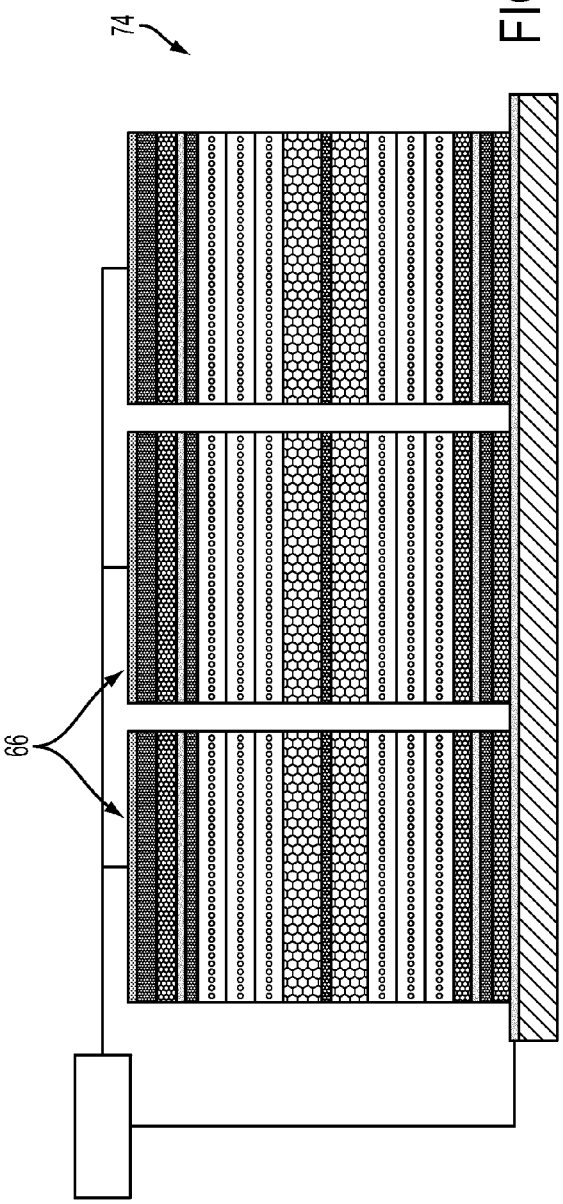

Another example embodiment of a voltaic cell 66 is shown in FIG. 5. Voltaic cell 66 is similar to cell 48, but has multiple dielectric layers 26 and 28 with quantum dots similar to the cell 36 shown in FIG. 3. FIGS. 6, 7, 8 and 9 show batteries 68, 70, 72 and 74 formed by connecting a plurality of cells 10 (FIG. 6), 46 (FIG. 7), 48 (FIG. 8) and 66 (FIG. 9) respectively, in parallel.

Theoretical calculations applicable to voltaic cells as described herein indicate an output power density, for a 1 µm thick sample, of approximately 0.1 mW/cm$^2$. For a practical cell, an output voltage of about 1 V and a current of about 0.1 mA may be expected. It is thought possible, by stacking several cells, to achieve a 1 mW battery, where a 1 mW battery is defined as that having this power output at the end of one tritium half-life, i.e., approximately 12 years. Further by way of example, an output of 1 mW is expected to be achievable using a 10 µm thick voltaic cell. Similarly, to achieve 10 mW power output, a 100 µm thick cell is expected to suffice.

Voltaic cells according to the invention could be used for numerous, widespread applications in the microelectronic market, including, for example, robotics, alarm devices, computer technology, light emitting devices, i-pods, and pacemakers. The relatively small size of the voltaic cells (as small as 1 mm$^2$) makes them highly adaptable for integration into existing microelectronic components. Applications in the medical field are expected to be significant. The current "system" of charging batteries for artificial, life sustaining devices is not very humane, since the patient spends more time charging his/her battery than being free from the charging process. There is also the psychological issue of "charge anxiety" where the patient is anxious about the battery's state of charge. The expected long life (measured in years) of voltaic cells according to the invention is expected to free patients from recharge concerns and give them years of charge-free use. Other applications include using the voltaic cell as a trickle-recharger for other types of batteries.

What is claimed is:

1. A voltaic cell, comprising:
   a radioactive layer comprising a radioactive material, said radioactive layer having first and second sides oppositely disposed;
   a first n-type semiconductor layer overlying said first side of said radioactive layer;
   a first p-type semiconductor layer overlying said second side of said radioactive layer;
   a first dielectric layer overlying said first n-type semiconductor layer, said first dielectric layer comprising a plurality of quantum dots;
   a second dielectric layer overlying said first p-type semiconductor layer, said second dielectric layer comprising a plurality of quantum dots;
   a first conductor layer overlying said first dielectric layer; and
   a second conductor layer overlying said second dielectric layer.

2. The voltaic cell according to claim 1, further comprising:
   a second n-type semiconductor layer positioned between said first conductor layer and said first dielectric layer; and
   a second p-type semiconductor layer positioned between said second conductor layer and said second dielectric layer.

3. The voltaic cell according to claim 2, wherein said second p-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

4. The voltaic cell according to claim 3, wherein said second p-type semiconductor layer is doped with an element selected from the group consisting of boron, aluminum, gallium, indium and combinations thereof.

5. The voltaic cell according to claim 2, further comprising:
   a first tunnel junction layer positioned between said second n-type semiconductor layer and said first conductor layer;
   a third p-type semiconductor layer positioned between said first tunnel junction layer and said first conductor layer;
   a third n-type semiconductor layer positioned between said third p-type semiconductor layer and said first conductor layer.

6. The voltaic cell according to claim 5, wherein said first tunnel junction layer comprises a p-n junction.

7. The voltaic cell according to claim 5, further comprising:
   a second tunnel junction layer positioned between said second p-type semiconductor layer and said second conductor layer;
   a fourth n-type semiconductor layer positioned between said second tunnel junction layer and said second conductor layer;
   a fourth p-type semiconductor layer positioned between said fourth n-type semiconductor layer and said second conductor layer.

8. The voltaic cell according to claim 6, wherein said second tunnel junction layer comprises a p-n junction.

9. The voltaic cell according to claim 1, wherein said radioactive layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

10. The voltaic cell according to claim 9, wherein said radioactive material is selected from the group consisting of tritium, carbon 14, magnesium 23, germanium 76, silicon 32, cadmium 113, indium 115 rubidium 87, potassium 40 and combinations thereof.

11. The voltaic cell according to claim 1, wherein said first n-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

12. The voltaic cell according to claim 11, wherein said first n-type semiconductor layer is doped with an element selected from the group consisting of phosphorous, nitrogen, arsenic, antimony and combinations thereof.

13. The voltaic cell according to claim 1, wherein said first p-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

14. The voltaic cell according to claim 13, wherein said first p-type semiconductor layer is doped with an element selected from the group consisting of boron, aluminum, gallium, indium and combinations thereof.

15. The voltaic cell according to claim 2, wherein said second n-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

16. The voltaic cell according to claim 15, wherein said second n-type semiconductor layer is doped with an element selected from the group consisting of phosphorous, nitrogen, arsenic, antimony and combinations thereof.

17. The voltaic cell according to claim 1, wherein at least one of said first and second conductor layers comprise a metal.

18. The voltaic cell according to claim 17, wherein said metal is selected from the group consisting of gold, silver, copper, aluminum and combinations thereof.

19. The voltaic cell according to claim 1, wherein at least one of said first and second dielectric layers comprises a material selected from the group consisting of silicon oxide and silicon nitride.

20. The voltaic cell according to claim 1, wherein said quantum dots comprise silicon.

21. The voltaic cell according to claim 1, wherein said quantum dots have a size from about 1 nm to about 10 nm.

22. The voltaic cell according to claim 1, wherein said quantum dots are disbursed throughout at least one of said first and second dielectric layers at a density of about $10^{21}$ cm$^{-3}$.

23. The voltaic cell according to claim 1, wherein said quantum dots are disbursed throughout at least one of said first and second dielectric layers at a density from about $10^8$ cm$^{-2}$ to about $10^{11}$ cm$^{-2}$.

24. The voltaic cell according to claim 1, wherein said quantum dots are arranged in a three-dimensional array in at least one of said first and second dielectric layers.

25. The voltaic cell according to claim 1, wherein said quantum dots are arranged substantially at the surface of at least one of said first and second dielectric layers.

26. The voltaic cell according to claim 1, wherein said quantum dots have a substantially spherical shape.

27. The voltaic cell according to claim 1, wherein said quantum dots have a substantially pyramidal shape.

28. The voltaic cell according to claim 1, wherein said quantum dots are sized and spaced apart from one another within said dielectric layers so as to promote quantum mechanical tunneling of charge carriers from said radioactive layer to said conductor layers.

29. The voltaic cell according to claim 28, wherein said charge carriers have energies from about 1 eV to about 5 eV.

30. The voltaic cell according to claim 1, further comprising a plurality of first dielectric layers positioned between said first n-type semiconductor layer and said first conductor layer.

31. The voltaic cell according to claim 30, comprising at least three of said first dielectric layers.

32. The voltaic cell according to claim 30, wherein said quantum dots of at least one of said first dielectric layers are of a different size from said quantum dots of at least one other of said first dielectric layers.

33. The voltaic cell according to claim 30, wherein said quantum dots of at least one of said first dielectric layers are spaced apart from one another at a different spacing from said quantum dots of at least one other of said first dielectric layers.

34. The voltaic cell according to claim 1, further comprising a plurality of second dielectric layers positioned between said first p-type semiconductor layer and said second conductor layer.

35. The voltaic cell according to claim 34, comprising at least three of said second dielectric layers.

36. The voltaic cell according to claim 34, wherein said quantum dots of at least one of said second dielectric layers are of a different size from said quantum dots of at least one other of said second dielectric layers.

37. The voltaic cell according to claim 34, wherein said quantum dots of at least one of said second dielectric layers are spaced apart from one another at a different spacing from said quantum dots of at least one other of said second dielectric layers.

38. A battery comprising a plurality of voltaic cells according to claim 1.

39. A voltaic cell, comprising:
    a semiconductor layer having a p-type region and an n-type region forming a first p-n junction;
    a radioactive layer positioned within said semiconductor layer between said p-type region and said n-type region;
    at least a first dielectric layer overlying said n-type region, said first dielectric layer comprising a plurality of quantum dots;
    at least a second dielectric layer overlying said p-type region, said second dielectric layer comprising a plurality of quantum dots;
    an n-type semiconductor layer overlying said first dielectric layer;
    a p-type semiconductor layer overlying said second dielectric layer;
    a first conductor layer overlying said n-type semiconductor layer;
    a second conductor layer overlying said p-type semiconductor layer.

40. The voltaic cell according to claim 39, further comprising:
    a plurality of said first dielectric layers overlying said n-type region;
    a plurality of said second dielectric layers overlying said p-type region.

41. The voltaic cell according to claim 40, further comprising:
    a second p-n junction having a p-type region and an n-type region, said second p-n junction being positioned between said n-type semiconductor layer and said first conductor layer, said p-type region of said second p-n junction being adjacent to said n-type semiconductor layer;
    a first tunnel junction layer positioned between said p-type region of said second p-n junction and said n-type semiconductor layer;
    a third p-n junction having a p-type region and an n-type region, said third p-n junction being positioned between said p-type semiconductor layer and said second conductor layer, said n-type region of said third p-n junction being adjacent to said p-type semiconductor layer;
a second tunnel junction layer positioned between said n-type region of said third p-n junction and said p-type semi-conductor layer.

42. The voltaic cell according to claim 39, further comprising:
a second p-n junction having a p-type region and an n-type region, said second p-n junction being positioned between said n-type semiconductor layer and said first conductor layer, said p-type region of said second p-n junction being adjacent to said n-type semiconductor layer;
a first tunnel junction layer positioned between said p-type region of said second p-n junction and said n-type semiconductor layer;
a third p-n junction having a p-type region and an n-type region, said third p-n junction being positioned between said p-type semiconductor layer and said second conductor layer, said n-type region of said third p-n junction being adjacent to said p-type semiconductor layer;
a second tunnel junction layer positioned between said n-type region of said third p-n junction and said p-type semi-conductor layer.

43. The voltaic cell according to claim 42, wherein at least one of said tunnel junction layers comprises a p-n junction.

44. The voltaic cell according to claim 39, wherein said radioactive layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

45. The voltaic cell according to claim 39, wherein said radioactive layer comprises a material selected from the group consisting of tritium, carbon 14, magnesium 23, germanium 76, silicon 32, cadmium 113, indium 115 rubidium 87, potassium 40 and combinations thereof.

46. The voltaic cell according to claim 39, wherein said n-type region comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

47. The voltaic cell according to claim 46, wherein said n-type region is doped with an element selected from the group consisting of phosphorous, nitrogen, arsenic, antimony and combinations thereof.

48. The voltaic cell according to claim 39, wherein said p-type region comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

49. The voltaic cell according to claim 48, wherein said p-type region is doped with an element selected from the group consisting of boron, aluminum, gallium, indium and combinations thereof.

50. The voltaic cell according to claim 39, wherein said n-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

51. The voltaic cell according to claim 50, wherein said n-type semiconductor layer is doped with an element selected from the group consisting of phosphorous, nitrogen, arsenic, antimony and combinations thereof.

52. The voltaic cell according to claim 39, wherein said p-type semiconductor layer comprises a material selected from the group consisting of amorphous hydrogenated silicon, crystalline hydrogenated silicon, amorphous hydrogenated silicon carbide, crystalline hydrogenated silicon carbide, diamond-like carbon, amorphous hydrogenated carbon, crystalline hydrogenated carbon, crystalline silicon, germanium, carbon, gallium-arsenide, indium-gallium-arsenide, gallium-nitride, indium-arsenide, zinc-selenium, zinc-sulfide, silicon-carbide, indium-selenide and aluminum-indium-gallium-phosphorous.

53. The voltaic cell according to claim 52, wherein said p-type semiconductor layer is doped with an element selected from the group consisting of boron, aluminum, gallium, indium and combinations thereof.

54. The voltaic cell according to claim 39, wherein at least one of said first and second conductor layers comprises a metal.

55. The voltaic cell according to claim 54, wherein said metal is selected from the group consisting of gold, silver, copper, aluminum and combinations thereof.

56. The voltaic cell according to claim 39, wherein at least one of said first and second dielectric layers comprises a material selected from the group consisting of silicon oxide and silicon nitride.

57. The voltaic cell according to claim 39, wherein said quantum dots comprise silicon.

58. The voltaic cell according to claim 39, wherein said quantum dots have a size from about 1 nm to about 10 nm.

59. The voltaic cell according to claim 39, wherein said quantum dots are disbursed throughout at least one of said first and second dielectric layers at a density of about $10^{21}$ cm$^{-3}$.

60. The voltaic cell according to claim 39, wherein said quantum dots are disbursed throughout at least one of said first and second dielectric layers at a density from about $10^8$ cm$^{-2}$ to about $10^{11}$ cm$^{-2}$.

61. The voltaic cell according to claim 39, wherein said quantum dots are arranged in a three-dimensional array in at least one of said first and second dielectric layers.

62. The voltaic cell according to claim 39, wherein said quantum dots are arranged substantially at the surface of at least one of said first and second dielectric layers.

63. The voltaic cell according to claim 39, wherein said quantum dots have a substantially spherical shape.

64. The voltaic cell according to claim 39, wherein said quantum dots have a substantially pyramidal shape.

65. The voltaic cell according to claim 39, wherein said quantum dots are sized and spaced apart from one another within at least one of said dielectric layers so as to promote quantum mechanical tunneling of charge carriers from said radioactive layer to said conduction layers.

66. The voltaic cell according to claim 65, wherein said charge carriers have energies from about 1 eV to about 5 eV.

67. The voltaic cell according to claim 39, further comprising a plurality of first dielectric layers positioned between said n-type semiconductor layer and said first conductor layer.

68. The voltaic cell according to claim 67, comprising at least three of said first dielectric layers.

69. The voltaic cell according to claim 67, wherein said quantum dots of at least one of said first dielectric layers are of a different size from said quantum dots of at least one other of said first dielectric layers.

70. The voltaic cell according to claim 67, wherein said quantum dots of at least one of said first dielectric layers are spaced apart from one another at a different spacing from said quantum dots of at least one other of said first dielectric layers.

71. The voltaic cell according to claim 39, further comprising a plurality of second dielectric layers positioned between said p-type semiconductor layer and said second conductor layer.

72. The voltaic cell according to claim 71, comprising at least three of said second dielectric layers.

73. The voltaic cell according to claim 71, wherein said quantum dots of at least one of said second dielectric layers are of a different size from said quantum dots of at least one other of said second dielectric layers.

74. The voltaic cell according to claim 71, wherein said quantum dots of at least one of said second dielectric layers are spaced apart from one another at a different spacing from said quantum dots of at least one other of said second dielectric layers.

75. A battery comprising a plurality of voltaic cells according to claim 39.

76. A voltaic cell, comprising:
a radioactive layer comprising a radioactive material and a semiconductor having energy band gaps from about 1 eV to about 4 eV, said radioactive layer having first and second sides oppositely disposed;
a first n-type semiconductor layer overlying said first side of said radioactive layer;
a first p-type semiconductor layer overlying said second side of said radioactive layer;
a first dielectric layer overlying said first n-type semiconductor layer, said first dielectric layer comprising a plurality of quantum dots;
a second dielectric layer overlying said first p-type semiconductor layer, said second dielectric layer comprising a plurality of quantum dots;
a first conductor layer overlying said first dielectric layer; and
a second conductor layer overlying said second dielectric layer.

77. The voltaic cell according to claim 76, further comprising:
a second n-type semiconductor layer positioned between said first conductor layer and said first dielectric layer; and
a second p-type semiconductor layer positioned between said second conductor layer and said second dielectric layer.

78. The voltaic cell according to claim 77, further comprising:
a first tunnel junction layer positioned between said second n-type semiconductor layer and said first conductor layer;
a third p-type semiconductor layer positioned between said first tunnel junction layer and said first conductor layer;
a third n-type semiconductor layer positioned between said third p-type semiconductor layer and said first conductor layer.

79. The voltaic cell according to claim 78, further comprising:
a second tunnel junction layer positioned between said second p-type semiconductor layer and said second conductor layer;
a fourth n-type semiconductor layer positioned between said second tunnel junction layer and said second conductor layer;
a fourth p-type semiconductor layer positioned between said fourth n-type semiconductor layer and said second conductor layer.

80. The voltaic cell according to claim 76, wherein said quantum dots have a size from about 1 nm to about 10 nm.

81. The voltaic cell according to claim 76, wherein said quantum dots are disbursed throughout at least one of said first and second dielectric layers at a density of about $10^{21}$ $cm^{-3}$.

82. The voltaic cell according to claim 76, wherein said quantum dots are disbursed throughout said first and second dielectric layers at a density from about $10^8$ $cm^{-2}$ to about $10^{11}$ $cm^{-2}$.

83. The voltaic cell according to claim 76, wherein said quantum dots are arranged in a three-dimensional array in said first and second dielectric layers.

84. The voltaic cell according to claim 76, wherein said quantum dots are arranged substantially at the surface of at least one of said first and second dielectric layers.

85. The voltaic cell according to claim 76, wherein said quantum dots have a substantially spherical shape.

86. The voltaic cell according to claim 76, wherein said quantum dots have a substantially pyramidal shape.

87. The voltaic cell according to claim 76, wherein said quantum dots are sized and spaced apart from one another within said dielectric layers so as to promote quantum mechanical tunneling of charge carriers from said radioactive layer to said conduction layers.

88. The voltaic cell according to claim 87, wherein said charge carriers have energies from about 1 eV to about 5 eV.

89. The voltaic cell according to claim 76, further comprising a plurality of first dielectric layers positioned between said first n-type semiconductor layer and said first conductor layer.

90. The voltaic cell according to claim 89, wherein said quantum dots of at least one of said first dielectric layers are of a different size from said quantum dots of at least one other of said first dielectric layers.

91. The voltaic cell according to claim 89, wherein said quantum dots of at least one of said first dielectric layers are spaced apart from one another at a different spacing from said quantum dots of at least one other of said first dielectric layers.

92. The voltaic cell according to claim 89, further comprising a plurality of second dielectric layers positioned between said first p-type semiconductor layer and said second conductor layer.

93. The voltaic cell according to claim 92, wherein said quantum dots of at least one of said second dielectric layers are of a different size from said quantum dots of at least one other of said second dielectric layers.

94. The voltaic cell according to claim 92, wherein said quantum dots of at least one of said second dielectric layers are spaced apart from one another at a different spacing from said quantum dots of at least one other of said second dielectric layers.

95. A battery comprising a plurality of voltaic cells according to claim 76.

* * * * *